United States Patent
Khbeis et al.

(10) Patent No.: US 7,286,359 B2
(45) Date of Patent: Oct. 23, 2007

(54) USE OF THERMALLY CONDUCTIVE VIAS TO EXTRACT HEAT FROM MICROELECTRONIC CHIPS AND METHOD OF MANUFACTURING

(75) Inventors: Michael Khbeis, Severn, MD (US); George Metze, Millersville, MD (US); Neil Goldsman, Takoma Park, MD (US); Akin Akturk, Lanham, MD (US)

(73) Assignee: The U.S. Government as represented by the National Security Agency, Washington, DC (US)

( * ) Notice: Subject to any disclaimer, the term of this patent is extended or adjusted under 35 U.S.C. 154(b) by 0 days.

(21) Appl. No.: 10/842,731

(22) Filed: May 11, 2004

(65) Prior Publication Data

US 2005/0254215 A1  Nov. 17, 2005

(51) Int. Cl.
*H05K 7/20* (2006.01)
*F28F 7/00* (2006.01)
*H01L 23/34* (2006.01)

(52) U.S. Cl. ............ 361/704; 361/719; 165/80.2; 165/80.3; 257/720; 257/713

(58) Field of Classification Search ............... 361/704
See application file for complete search history.

(56) References Cited

U.S. PATENT DOCUMENTS

| | | |
|---|---|---|
| 5,170,319 A | 12/1992 | Chao-Fan Chu et al. |
| 5,199,165 A | 4/1993 | Crawford et al. |
| 5,473,813 A | 12/1995 | Chobot et al. |
| 5,933,324 A * | 8/1999 | Barrett .................. 361/703 |
| 5,992,159 A | 11/1999 | Edwards et al. |
| 6,008,536 A | 12/1999 | Mertol |
| 6,156,980 A | 12/2000 | Peugh et al. |
| 6,219,243 B1 | 4/2001 | Ma et al. |
| 6,230,399 B1 | 5/2001 | Maheshwari et al. |
| 6,236,098 B1 | 5/2001 | Efland et al. |
| 6,243,269 B1 | 6/2001 | Dibene, II et al. |
| 6,260,613 B1 | 7/2001 | Pollard, II |
| 6,292,366 B1 | 9/2001 | Platt |
| 6,300,165 B2 | 10/2001 | Castro |
| 6,314,216 B1 | 11/2001 | Schulte et al. |
| 6,335,862 B1 | 1/2002 | Koya |
| 6,349,033 B1 | 2/2002 | Dubin et al. |
| 6,373,348 B1 | 4/2002 | Hagerup |
| 6,396,700 B1 | 5/2002 | Chu et al. |

(Continued)

FOREIGN PATENT DOCUMENTS

DE  10350792 A1 *  6/2005

*Primary Examiner*—Jayprakash Gandhi
*Assistant Examiner*—Zachary M Pape
(74) *Attorney, Agent, or Firm*—Arent Fox LLP

(57) ABSTRACT

A cooling device for a microcircuit provides a direct path of thermal extraction from a high heat producing area to a cooler area. A thermal insulation layer is formed on a body having at least one component thereon that generates the high heat producing area. At least one via is formed through an entire thickness of the insulation layer and is in direct communication with the high heat producing area. Heat from the high heat producing area is channeled through each via to the cooler area, which may be ambient atmosphere or a good thermal conductor, such as a heat sink. A thermal conductive material may be deposited within the via and increase the rate of thermal extraction therethrough.

11 Claims, 5 Drawing Sheets

U.S. PATENT DOCUMENTS

| | | |
|---|---|---|
| 6,432,742 B1 | 8/2002 | Guan et al. |
| 6,432,809 B1 | 8/2002 | Tonti et al. |
| 6,461,892 B2 * | 10/2002 | Beroz .................... 438/106 |
| 6,461,927 B1 | 10/2002 | Mochizuki et al. |
| 6,476,446 B2 | 11/2002 | Ju |
| 6,477,054 B1 | 11/2002 | Hagerup |
| 6,521,845 B1 | 2/2003 | Barrow |
| 6,525,419 B1 | 2/2003 | Deeter et al. |
| 6,525,942 B2 * | 2/2003 | Huang et al. ............ 361/704 |
| 6,528,882 B2 | 3/2003 | Ding et al. |
| 6,534,861 B1 | 3/2003 | Castro |
| 6,552,907 B1 | 4/2003 | Caldwell |
| 6,566,741 B2 | 5/2003 | Lin et al. |
| 6,570,247 B1 | 5/2003 | Eiles et al. |
| 6,574,108 B1 | 6/2003 | Kramer et al. |
| 6,583,513 B1 | 6/2003 | Utagikar et al. |
| 6,588,217 B2 | 7/2003 | Ghoshal |
| 6,891,161 B2 * | 5/2005 | Ionescu et al. .......... 250/338.4 |
| 2002/0008283 A1 | 1/2002 | Ju |
| 2002/0134419 A1 | 9/2002 | Macris |
| 2002/0171138 A1 * | 11/2002 | Osone et al. ............ 257/712 |
| 2003/0042006 A1 | 3/2003 | German et al. |
| 2004/0174682 A1 * | 9/2004 | Lin et al. ................ 361/705 |

* cited by examiner

USE OF THERMALLY CONDUCTIVE VIAS TO EXTRACT HEAT FROM MICROELECTRONIC CHIPS AND METHOD OF MANUFACTURING

STATEMENT OF GOVERNMENT INTEREST

The Federal government has rights in this invention pursuant to contract no. MDA 90499C2506 between the Department of the Defense and the University of Maryland.

BACKGROUND OF THE INVENTION

1. Field of the Invention

The present invention relates to the use of precisely positioned micron-sized thermally conducting via holes in semiconductor materials to precisely and efficiently remove heat from high heat producing areas in semiconductor components/devices or chips to ambient atmosphere or a heat sink.

2. Description of Related Art

Microelectronic chips are typically thermally insulated by passivation and bulk materials, which make thermal transfer extremely inefficient. As a result, the design and operation of the microelectronic chip is adversely affected. Additionally, significant size and financial costs are associated with removing heat from high performance microelectronic chips.

Within the microelectronic chip industry, there is a continuous effort to improve operation of microelectronic chips. However, as shown in FIG. 1, there is a rather significant problem of localized high heating areas 114 among circuit components 112 for chips 110, which results from high switching frequency and/or high operating voltages or currents. The localized heating problem is typically aggravated by the use of multiple layers of thermally insulating materials 130, such as oxides and nitrides added for electrical isolation, or use of spin-on-glass (SOG) for environmental protection and packaging. In addition, heat problems can be exacerbated simply by the presence of bulk substrates 120, which are made primarily of silicon, upon which active devices, e.g., circuit components, are fabricated.

FIG. 2 illustrates a conventional method of extracting heat from a microelectronic chip 210 via external heat dissipation H. The conventional method involves adding a heat sink 250, such as metallic fins, mounted to a top surface of the chip 210. However, the problem of localized high heating areas 214 remains among the components 212, as a result of, for example, high switching frequency and/or much higher current densities. The higher current densities are a direct result of the continuing trend to put more devices or circuits into a smaller area. Multiple layers of thermally insulating material 230 are disposed between the heat sink 250 and active devices 212, which are typically manufactured upon a bulk substrate 220.

While these methods provide some thermal extraction for the entire chip, unfortunately, the methods are not very efficient and may even be totally ineffective in extracting heat from localized high heat producing areas because of the presence of multiple layers of thermally insulating materials disposed between the heat producing region and the external package and/or heat sink.

Another conventional method for reducing heat effects involves reducing the thermal budget of the microelectronic chip by imposing operational limits. However, this approach sacrifices the performance of the microelectronic chip.

Other conventional methods of extracting heat from microelectronic chips include employing micro-fluidic cooling pumps that use micro-channels to pump a coolant around the chip, as disclosed, for example, in U.S. Pat. No. 5,170,319 to Chao-Fan Chu et al. A method of extracting heat from microelectronic chips by controlled spray cooling is disclosed in U.S. Pat. No. 5,992,159 to Edwards et al. In particular, the method of Edwards involves providing a condensed vapor mist on the chip package. Unfortunately, micro-fluidic pumps, as well as the spray cooling method, are difficult to implement. Moreover, rather complex apparatuses must be fabricated and then attached thereto, but without damaging the existing microelectronic chip, which add several levels of risk of component failure, while increasing cost and overall size.

Yet another method of extracting heat from microelectronic chips is disclosed by U.S. patent application Publication Number 2003/0042006 to German et al., wherein large diameter, through-substrate heat plugs using powder injection molding are employed. While large diameter through-substrate heat plugs are generally more reliable than the above-described conventional heat extraction methods, the large diameter heat plugs generally cannot be fabricated during initial device fabrication and are unable to specifically or accurately target high heat producing areas of the microelectronic chip.

SUMMARY OF THE INVENTION

To overcome the above-described problems of the conventional and other methods, as well as others, according to an aspect of the present invention, a thermal insulation layer is formed on a surface of a body of a microcircuit having at least one component thereon. The component has at least one high heat producing area that occurs from such factors as a high switching frequency, or current densities, and the like. At least one thermally conducting, e.g., filled with aluminum or some other conductive material, via (also interchangeably referred to herein as "hole") is formed through an entire thickness of the thermal insulation layer so as to be in direct communication by being either in direct contact or close proximity to the high heat producing area (also interchangeably referred to herein as a "shunt"). It is also possible to etch and form the thermally conducting via, or shunt, through the backside of the substrate material, which may be formed from such materials as silicon or gallium arsenide, upon which the electrical devices and circuits are built or otherwise fabricated. Such vias provide a direct path of thermal extraction from the high heat producing area to a cooler area. The cooler area may be ambient air or an element having a high rate of thermal conductivity, such as a heat sink, that is attached to a surface of the thermal insulation layer remote from the body of the microcircuit.

The present invention provides several advantages compared to other known thermal extraction approaches. For example, the present invention extracts heat more accurately from required areas as a result of the conductive thermal via shunts capable of being made less than 1 micron in diameter and positioned with extreme precision, i.e., to less than 1 micron accuracy anywhere within the circuit. As a result, the present invention provides a more efficient and cost effective technique for extracting heat from desired areas. Furthermore, because the technology required to place and position the thermal via shunts of the present invention is the same technology used to form the integrated circuits, the technique of the present invention is amenable to processing automation, which results in lower costs.

Also, the present invention may be particularly advantageous for use with three-dimensional circuits, although the present invention is also useful for two-dimensional circuits. The present invention is also particularly useful in high power applications.

According to one aspect of the present invention, the body of the microcircuit may be a microelectronic chip having a silicon-based substrate upon which the component is formed. According to another aspect of the present invention, the via may be formed through the entire thickness of the thermal insulation layer by dry etching, wet etching, micro-machining, or using liftoff techniques for layer patterning, or the like.

Moreover, according to yet another aspect of the present invention, a thermally conductive material may be deposited in the via to increase the rate of heat extraction through the via. The heat sink is preferably formed from a thermally conductive material, such as or including metal. Examples of the thermally conductive material include, but are not limited to, substances containing diamond, graphite, copper, aluminum, gold, and silver. Furthermore, the thermally conductive material may be deposited within the via by any one of physical vapor deposition, chemical vapor deposition, electroplating, vacuum casting, and spin casting.

According to yet another aspect of the present invention, the structural configuration of the present invention permits determining dimensions of the via using a height-to-width ratio between approximately 20:1 and 10:1. Therefore, when the thermal insulation layer has a thickness of, for example, 1 μm, the via would have a diameter in a range of 0.05 to 0.10 μm. Having such small vias allows placement of the thermal via shunts virtually anywhere near or between devices and circuits.

Additional advantages and novel features of the invention will be set forth in part in the description that follows, and in part will become more apparent to those in the art upon examination of the following or upon learning by practice of the invention.

BRIEF DESCRIPTION OF DRAWINGS

The present invention is illustrated by way of example and is not limited by the figures of the accompanying drawings, in which like references indicate similar elements, and in which.

DETAILED DESCRIPTION

An apparatus and method for removing heat from localized high heat producing areas of circuitry in microelectronic systems and devices, such as microelectronic chips, is described. In the following description, specific details are set forth, such as material types, dimensions, processing steps, and the like, in order to provide a thorough understanding of the present invention. However, the invention may be practiced without these specific details. In other instances, well-known elements and processing techniques have not been shown in particular detail in order to avoid unnecessarily obscuring the description of the present invention. This discussion will mainly be limited to those needs associated with removing heat from microelectronic systems and devices. It will be recognized, however, that such focus is for descriptive purposes only and the apparatus and methods of the present invention are applicable to other devices and components.

Figure 1:
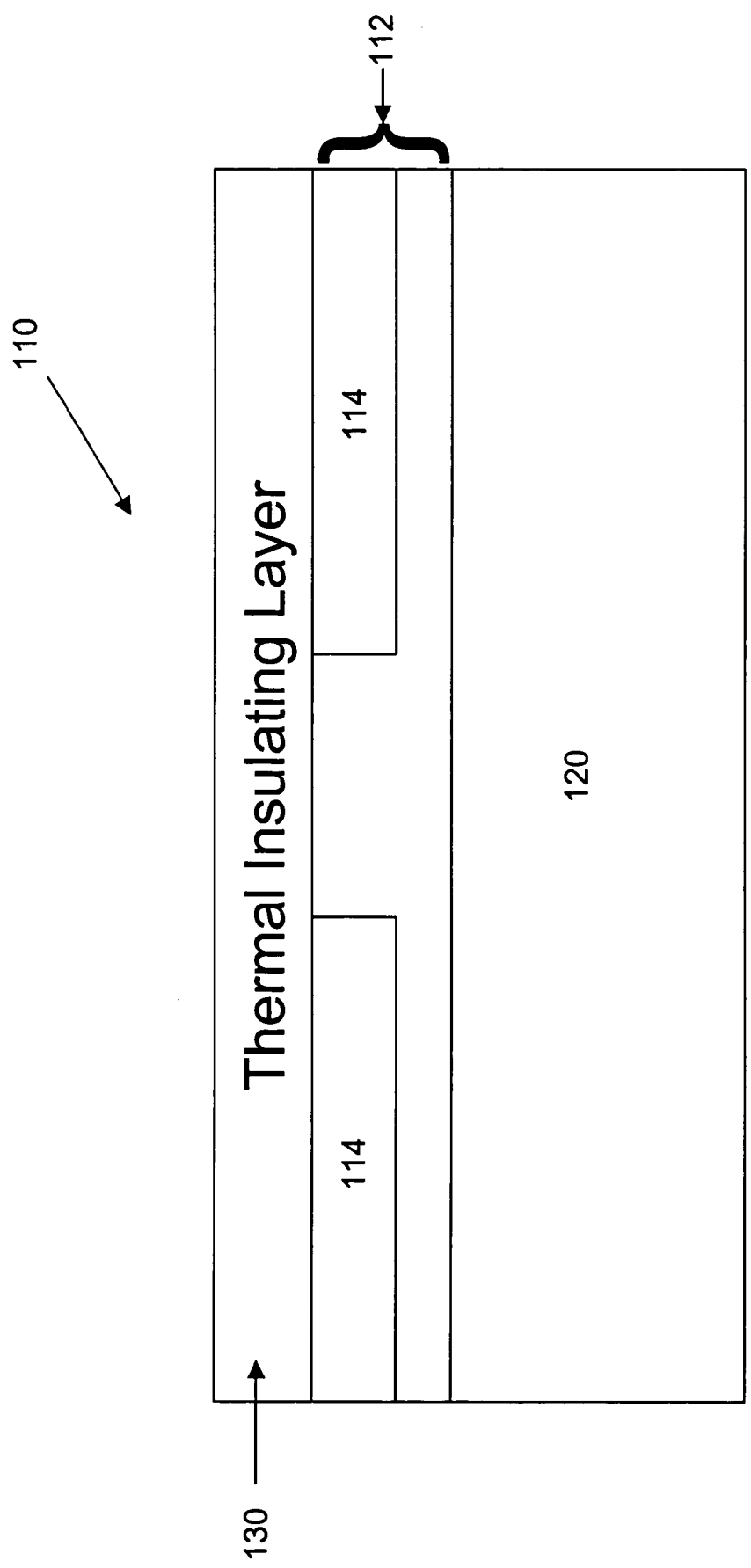
FIG. 1 is a cross-sectional view of a microelectronic chip.
Figure 2:
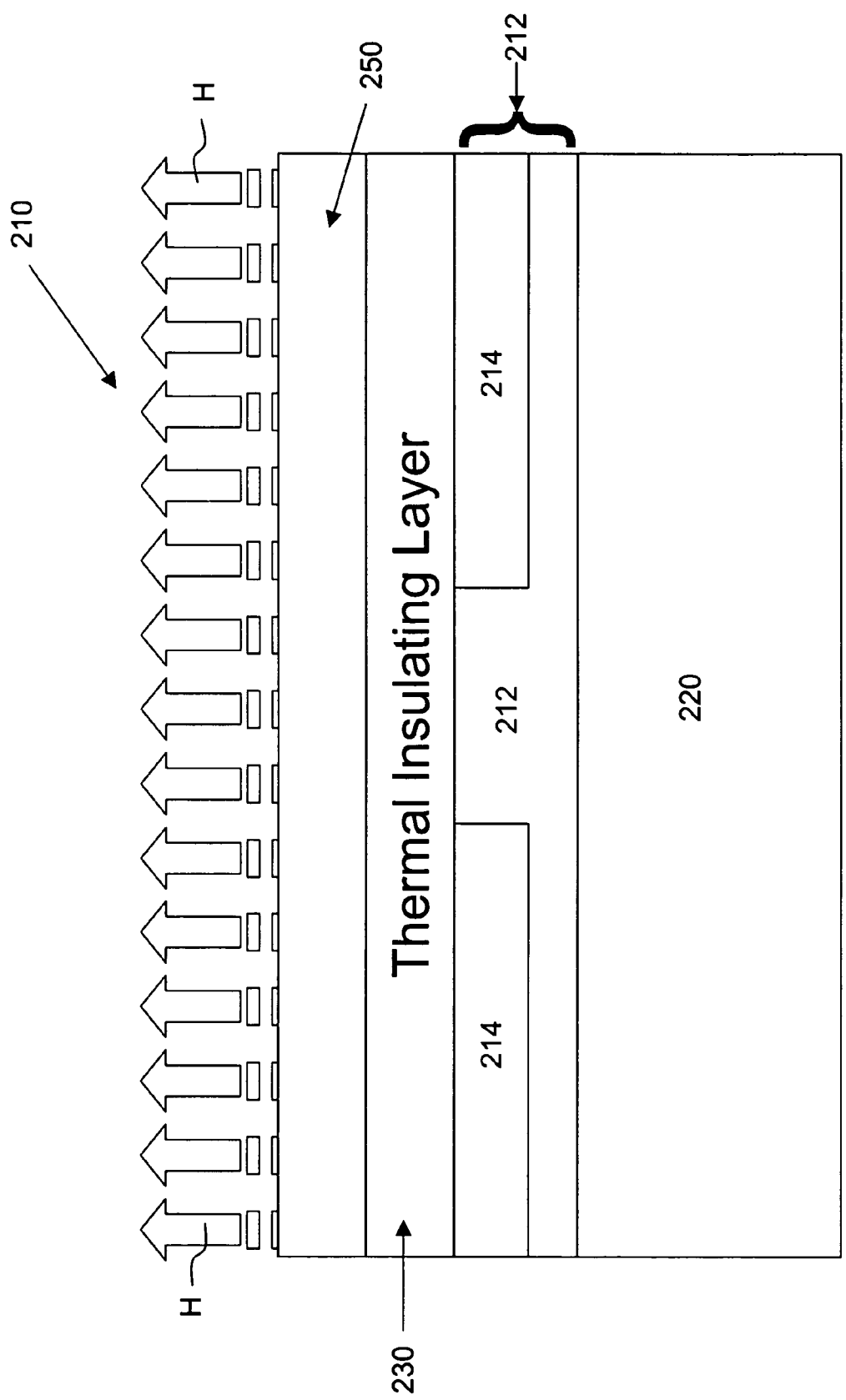
FIG. 2 is a cross-sectional view of a microelectronic chip having a heat sink provided thereon for passive heat extraction.
Figure 3:
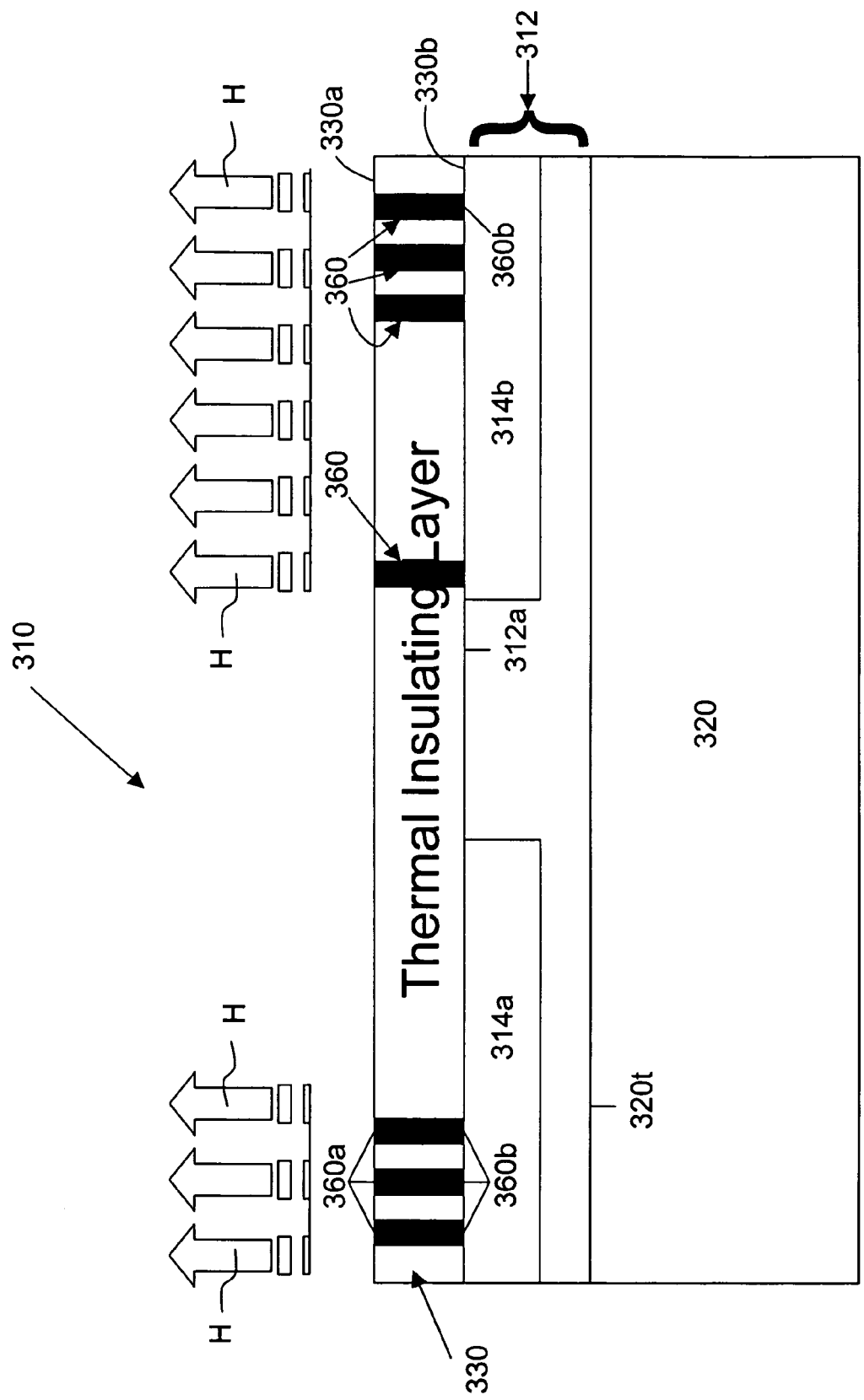
FIG. 3 is a cross-sectional view of a microelectronic chip having vias filled with conductive material according to an embodiment of the present invention.

FIG. 3 illustrates a cross-sectional view of an examplary microelectronic chip 310 having components and other circuit elements 312, fabricated thereon and, for example, electrically coupled, in a conventional manner, on a bulk substrate 320. The active devices 312 are disposed on a top surface 320t of the bulk substrate 320. The bulk substrate 320 is typically made of silicon, but may also be manufactured from any other well-known or later developed material having similar properties or applications.

The components 312 have localized high heat producing areas 314a, 314b that occur due to high switching frequency, and/or much higher current densities, high operating voltages or currents, or the like. A thermally insulating material 330 is formed on a top surface 312a of the components 312. Although only one layer 330 of thermally insulating material is shown in FIG. 3, it should be noted that a single layer is illustrated merely to simplify the description of the present invention, and it is within the scope of the invention and would be obvious to one of ordinary skill in the industry to form a plurality of thermal insulation layers 330 on the top surface 312a of the components 312.

As shown in FIG. 3, an outer surface 330a of the thermal insulation layer 330 is exposed to the ambient atmosphere. However, in another embodiment of the present invention shown in FIG. 4, a stiffening plate or heat sink 450 is thermally coupled to or otherwise emplaced on the outer surface 330a of the thermal insulation layer 330. The heat sink 450 may be any number of well-known conventional structures used for heat dissipation, such as a finned heat sink, constructed from well-known materials, such as metal. However, it is within the scope of the present invention to manufacture and use a heat sink 450 that is formed from an alternative material having similar strength, thermal and/or other conductivity characteristics as metal.

Figure 4:
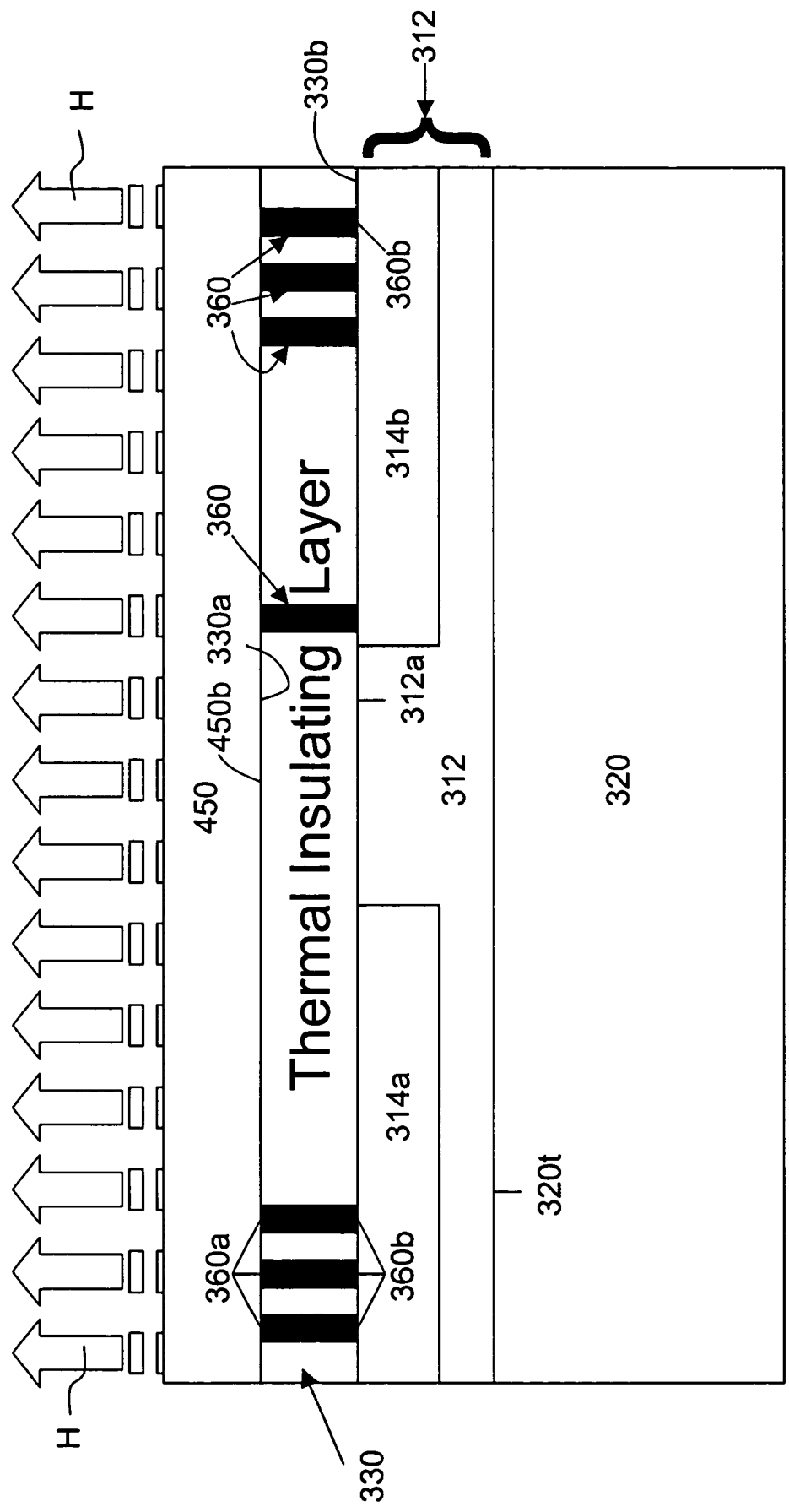
FIG. 4 is a cross-sectional view of a microelectronic chip having vias with conductive material and a heat sink according to another embodiment of the present invention.

As shown in both FIGS. 3 and 4, at least one heat plug via, or simply via, 360 is defined in the thermal insulation layer 330 and passes completely therethrough. Each via 360 has a first end 360a at the upper surface 330a of the thermal insulation layer 330 and a second end 360b at the lower surface 330b of the thermal insulation layer 330. In the embodiment of the present invention shown in FIG. 3, the first end 360a of each via 360 communicates with the ambient atmosphere 340. Alternatively, and in the embodiment of the present invention shown in FIG. 4, the first end 360a of each via 360 communicates with a bottom surface 450b of the heat sink 450.

Moreover, in the embodiments of the present invention shown in FIGS. 3 and 4, the second end 360b of each via 360 communicates with the top surface 312a of the components 312.

Each via 360 is formed to pass entirely through the thermal insulation layer 330 typically in a manner so as to directly communicate with high heat producing areas, but to avoid contacting existing or future electrical routing, e.g., metal. Each via 360 directly communicates with the corresponding high heat producing areas 314 by either being in direct contact or sufficiently close proximity to extract heat from the high heat producing areas 314. Moreover, it should be noted that each via 360 may be formed to be less than 1 micron (μm) in diameter and less than 1 micron (μm) from the electrical routing and/or the high heat producing areas 314. It is within the scope of the present invention to form each via 360 by etching; using liftoff techniques for layer patterning; LIGA, a German acronym for Lithographic, Galvanoformung, und Abformung; sacrificial bulk and surface micromachining; and any other known or future developed opening or aperture forming process. It should be noted that each via 360 can be formed by dry etching or wet etching. For example only, such dry etching processes as reactive ion etching (RIE), deep reactive ion etching (DRIE), helicon (MORI) high-density plasma source, plasma, and chemical, e.g., Xenon Difluoride (XeF$_2$), may be used. Likewise, all known and future developed etch chemicals may be used for the wet etching process.

After each via 360 is formed to pass entirely through the thermal insulation layer 330, the via 360 is optionally filled with a thermally conductive material to create a direct thermal contact or shunt from a heat producing layer to another layer. In other words, the via 360, upon being filled with the thermally conductive material, forms a shunt from the localized heat producing areas 314 of the microelectronic or other (e.g., optical) chip 310 to either the ambient atmosphere 340 as shown in the embodiment of FIG. 3 or to the heat sink 450 shown in the embodiment of FIG. 4. Each via 360 may be filled with a thermally conductive material using several well known processes, such as physical vapor deposition; chemical vapor deposition, electroplating, vacuum or spin casting, and any other known or future developed filling process. Examples of physical vapor deposition include, but are not limited to sputtering, e-beam evaporation, reflow, and forcefill. Examples of chemical vapor deposition include, but are not limited to chemical vapor deposition (CVD), plasma enhanced chemical vapor deposition (PECVD), metal organic chemical vapor deposition (MOCVD), atmospheric pressure chemical vapor deposition (APCVD), and molecular beam epitaxy (MBE) growth.

Each via 360 that is filled with the thermally conductive material provides direct thermal conduction from the targeted high heat producing areas 314 to the ambient atmosphere 340 or a heat sink 450 to facilitate efficient heat extraction H at a point of greatest or highest heat generation of the chip 310.

In one embodiment, an approximately 20 to 1 to 10 to 1, i.e., 20:1 to 10:1, aspect or height-to-width ratio is used to determine the dimensions of the vias 360. For example, for a thermal insulating layer 330 having a thickness of 1 μm, each via 360 has a diameter that is 0.05 to 0.10 μm. Likewise, for a relatively thick thermal insulating layer 330, such as 20 μm, each via 360 has a diameter that is 1.0 to 2.0 μm. It is within the scope of the present invention to provide, for use with a thick thermal insulating layer 330, several fabrication iterations, which produce thin insulating layers 330 and obtain vias 360 of corresponding diameter.

The direct contact provided by the via 360 filled with thermally conductive material when targeting the localized high heat producing areas 314 allows highly efficient thermal conduction to a cooling medium. Among other things, this approach overcomes the disadvantages of conventional cooling methods, which rely solely on cooling by exterior packaging or reducing thermal budget in a manner that limits chip performance. Because vias 360 provide a passive cooling technology, the use of vias 360 that directly contact a high heat producing area of the chip 310, among other things, also overcomes the disadvantages of other active cooling approaches, by eliminating the need for any external systems.

Further, the use of vias 360 addresses the disadvantages of through-substrate heat plug technology using powder injection molding. The present invention is Complimentary Metal Oxide Silicon (CMOS)-compatible and allows high-volume, batch processing during or after chip fabrication, while simultaneously providing smaller diameter channels that permit specific targeting of the high heat producing areas 314 on the chip 310.

The use of the vias 360 filled with thermally conductive material and in direct contact with the top surface 312a of the components 312 having the high heat producing areas 314, shown in FIGS. 3 and 4, also provides a direct path, by thermal conduction, from the high heat producing areas 314 to a cooler area, e.g., ambient atmosphere 340 or a heat sink 450, using sub-micron or micron sized vias 360. Moreover, with the present invention, a manufacturer is able to target specific high heat producing areas 314 on the chip 310, provide high-efficiency thermal conduction from the thermally insulated areas, obtain CMOS compatibility, and produce high throughput and batch compatibility. The present invention enables mass production at a low cost, can be implemented during or after the chip is manufactured, allows for a relaxation of thermal budgets, which permits a widening or increase in operational limits, and enables technology for next generation, three-dimensional circuits and devices.

Figure 5:
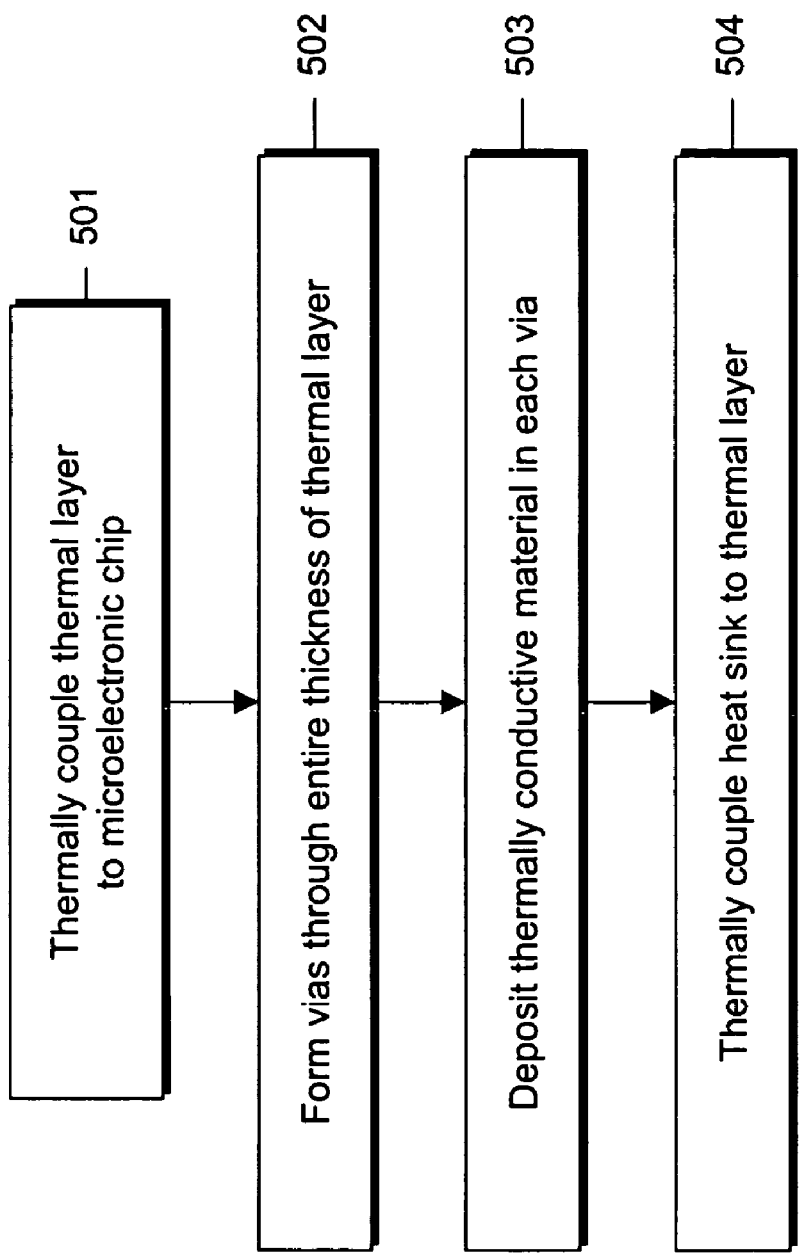
FIG. 5 is a flow chart illustrating a method for manufacturing the microelectronic chip of the present invention.

FIG. 5 is a flow chart of a method for manufacturing the microelectronic chip 310 having a plurality of vias 360 formed therein.

In step 501, a thermal insulation layer 330 is formed to the top surface 312a of the microelectronic chip 310.

In step 502, vias 360 are formed through an entire thickness of the thermal insulating layer 330 to contact a top surface 312a of the region of the chip 310 having the components 312 in locations of high heat production 314a, 314b. The vias 360 are formed so as not to contact existing or future electrical routing, or any other components of the circuitry of the chip 310. The thermal insulation layer 330 may be dry or wet etched, micro-machined, subjected to liftoff techniques for layer patterning, and the like to form or define the vias 360 therein.

In step 503, a thermally conductive material, such as material containing diamond, graphite, copper, aluminum, gold, silver, silicon carbide (SiC), superconducting polymers, ceramics, and the like, is deposited within each via 360 from a top surface 312a of the components 312 to the upper surface 330a of the thermal insulation layer 330. The deposition may be performed during the chip manufacturing process or after the chip 310 has been produced. The thermally conductive material may be deposited in the vias 360 by physical or chemical vapor deposition, electroplating, vacuum or spin casting, and the like.

In step 504, a heat sink 350 is thermally coupled to the upper surface 330a of the thermal insulation layer 330. (It should be noted that step 504 can be omitted for the embodiment of the present invention shown in FIG. 3.)

The present invention presents the ability to target the high heat producing areas of a microelectronic chip and provide significant operational advantages over the conventional methods, such as spray cooling, by providing passive cooling. As a result, the present invention costs less to manufacture and does not require the maintenance of additional equipment. Moreover, the vias filled with thermally conductive material can be placed as needed, with higher concentrations positioned in higher heat producing areas of the chip while avoiding critical structures, such as the electrical interconnects. Also, the filled vias directly communicate with the localized heat generating areas of the chip at one end while communicating with the ambient atmosphere or a heat sink at the other end, so as to create a direct heat conduction path that allows excess heat to efficiently flow from a point of origin or generation to the atmosphere or heat sink. The chip is thus cooled more efficiently than currently known approaches. Additionally, the filled vias permit the easy extraction of heat from individual circuit components or portions thereof.

What has been described herein is an apparatus and method for extracting heat from a microelectronic chip. In the foregoing detailed description, the apparatus and method of the present invention have been described with reference to exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A cooling device for a microcircuit, comprising:
   a substrate;
   a thermal insulation layer formed on the substrate;
   at least one microelectronic device disposed between the substrate and the thermal insulation layer, wherein the at least one microelectronic device has at least one high heat producing area; and
   at least one via formed through an entire thickness of said thermal insulation layer and in direct communication with said at least one high heat producing area, wherein said at least one via provides a direct path of thermal extraction from said at least one high heat producing area to a cooler area, wherein said thermal insulation layer has a thickness 1 μm or greater and said at least one via has a diameter in a range of 0.05 to 0.10 μm.

2. The cooling device according to claim 1, wherein said cooler area is an ambient atmosphere.

3. The cooling device according to claim 1, wherein a thermally conductive material is deposited within said at least one via.

4. The cooling device according to claim 3, wherein said thermally conductive material is any one of diamond, graphite, copper, aluminum, gold, silver, silicon carbide (SiC), a superconducting polymer, and ceramic.

5. The cooling device according to claim 3, wherein said thermally conductive material is deposited within said at least one via by any one of physical vapor deposition, chemical vapor deposition, electroplating, vacuum casting, and spin casting.

6. The cooling device according to claim 1, further comprising a heat sink provided on a first side of said thermal insulation layer remote from said at least one high heat producing area.

7. The cooling device according to claim 6, wherein said cooler area is said heat sink.

8. The cooling device according to claim 6, wherein said heat sink is manufactured from a thermally conductive material.

9. The cooling device according to claim 8, wherein said thermally conductive material is metal.

10. The cooling device according to claim 1, wherein when said thermal insulation layer has a thickness of 20 μm, said at least one via has a diameter in a range of 1.0 to 2.0 μm.

11. The cooling device according to claim 1, wherein said at least one via is formed by one of dry etching, wet etching, micromachining, using liftoff techniques for layer patterning, LIGA, and high pressure reflow/deformation.

* * * * *